(12) United States Patent
Shiba et al.

(10) Patent No.: US 7,971,964 B2
(45) Date of Patent: Jul. 5, 2011

(54) LIQUID DISCHARGE HEAD AND METHOD FOR MANUFACTURING THE SAME

(75) Inventors: Shoji Shiba, Kawasaki (JP); Akihiko Okano, Kawasaki (JP); Yoshikazu Saito, Kawasaki (JP); Kazuhiro Asai, Kawasaki (JP); Tamaki Sato, Kawasaki (JP); Takumi Suzuki, Yokohama (JP); Masahiko Kubota, Tokyo (JP); Maki Kato, Kawasaki (JP); Hiroe Ishikura, Kawasaki (JP); Shinsuke Tsuji, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 826 days.

(21) Appl. No.: 11/941,431

(22) Filed: Nov. 16, 2007

(65) Prior Publication Data

US 2008/0252689 A1      Oct. 16, 2008

(30) Foreign Application Priority Data

Dec. 22, 2006    (JP) .................................. 2006-346266

(51) Int. Cl.
    *B41J 2/14*    (2006.01)
(52) U.S. Cl. ........................................................ 347/47
(58) Field of Classification Search .................... 347/47
    See application file for complete search history.

(56) References Cited

U.S. PATENT DOCUMENTS

| 4,657,631 | A | 4/1987 | Noguchi |
| 6,379,571 | B1 | 4/2002 | Kobayashi et al. |
| 7,048,358 | B2 | 5/2006 | Kubota et al. |
| 2007/0011875 | A1 | 1/2007 | Kubota et al. |
| 2007/0046730 | A1* | 3/2007 | Min et al. ..................... 347/61 |

FOREIGN PATENT DOCUMENTS

JP    2001-10070 A    1/2001

* cited by examiner

*Primary Examiner* — Jerry T Rahll
(74) *Attorney, Agent, or Firm* — Fitzpatrick, Cella, Harper & Scinto

(57) ABSTRACT

A method for manufacturing a liquid discharge head including an energy generating element, which generates energy utilized for discharging a liquid, and a discharge portion provided at a position facing the energy generating element and having a discharge port for discharging the liquid is provided. This method includes the steps of forming a negative photosensitive resin layer used for a member that forms the discharge port on the substrate, and exposing the layer to an i-line to form the discharge portion that is tapered in a direction from the substrate to the discharge port, wherein the layer has an absorbance per 1 μm thickness of about 0.02 to about 0.07 for light used for the exposure.

6 Claims, 14 Drawing Sheets

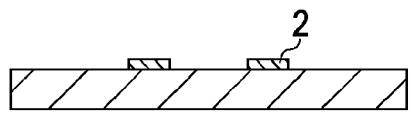
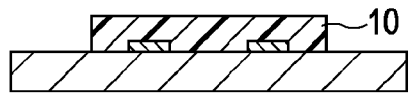
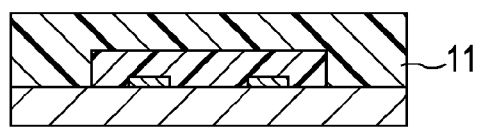
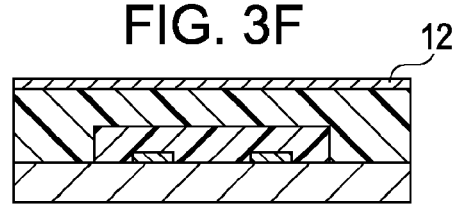
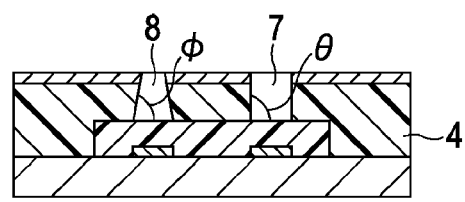
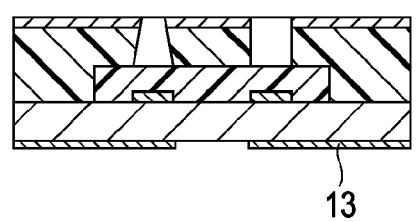
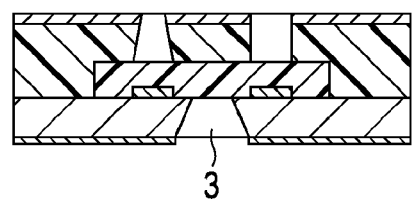
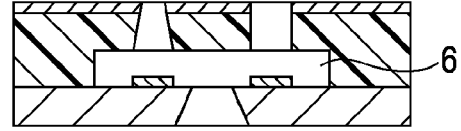

FIG. 4
(1) 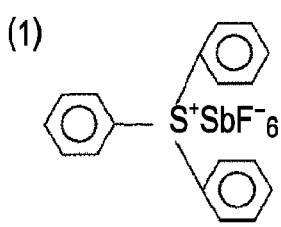
(2) 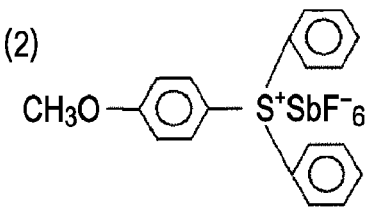
(3) 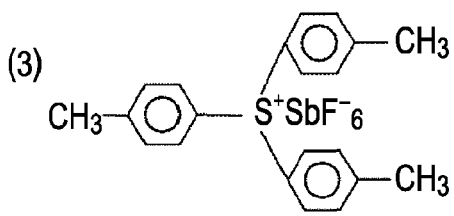
(4) 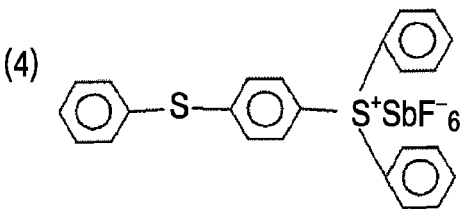
(5) 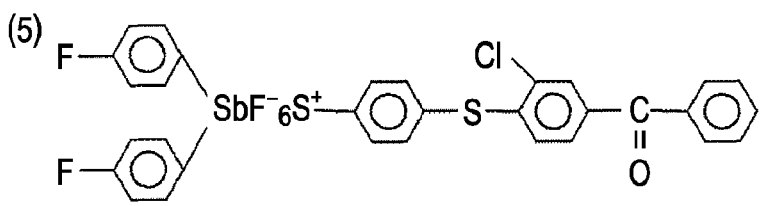
(6) 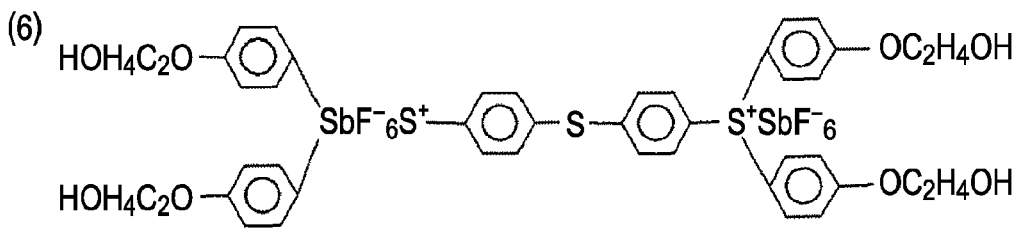
(7) 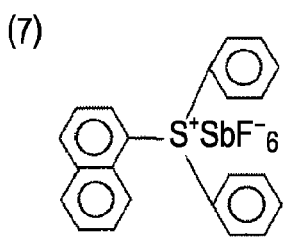
(8) 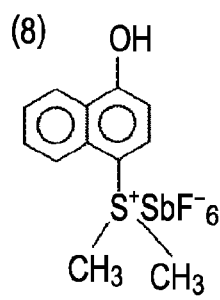
(9) 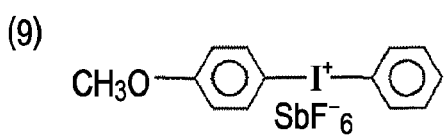
(10) 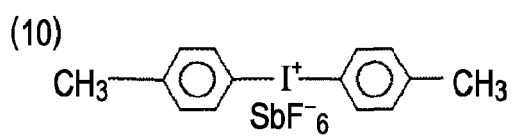

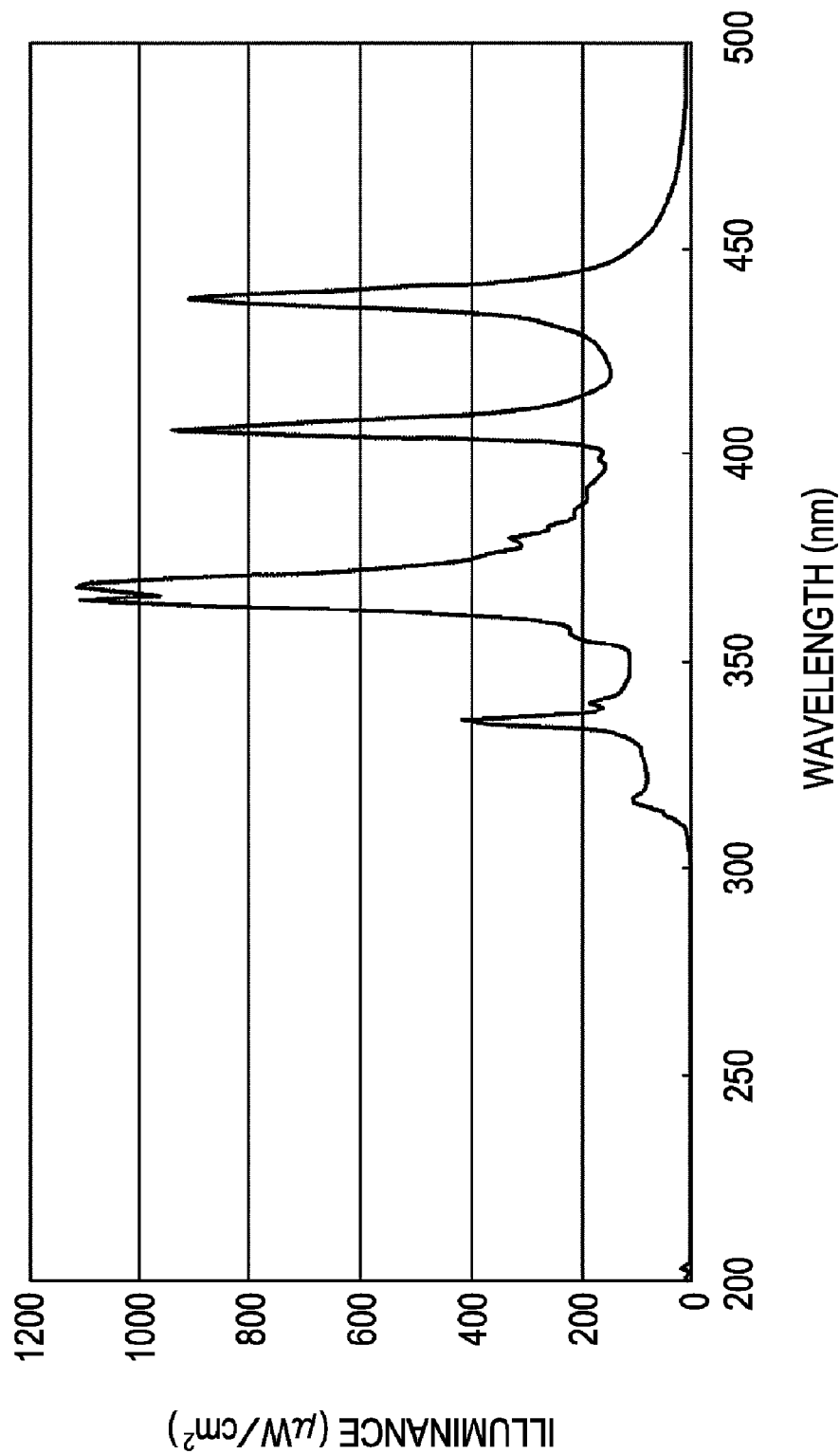

LIQUID DISCHARGE HEAD AND METHOD FOR MANUFACTURING THE SAME

BACKGROUND OF THE INVENTION

1. Field of the Invention

The present invention relates to a liquid discharge head for discharging a liquid and a method for manufacturing the same. Specifically, the present invention relates to an ink jet recording head, which is used for recording by discharging ink onto a recording medium, and a method for manufacturing the same.

2. Description of the Related Art

An ink jet recording head used in an ink jet recording system is an example of a liquid discharge head. An ink jet recording head generally has a passage, an energy generating element provided in the passage to generate the energy for discharging ink, and a fine ink discharge port (referred to as an "orifice") for discharging ink onto some form of media, such as paper.

U.S. Pat. No. 4,657,631 discloses an example of a conventional method for manufacturing such an ink jet recording head. Specifically, it discloses forming a passage pattern using a photosensitive material on a substrate on which energy generating elements have already been formed, and then applying a coating resin layer as a passage forming member on the substrate so as to cover the pattern. Next, a discharge port is formed in the coating resin layer, and then the photosensitive material used for the pattern is removed. This method is capable of fine processing with a very high level of precision for forming the passage and the discharge port because it employs a photolithographic method used in semiconductor manufacturing.

A recently developing trend is for the ink jet recording heads to have a smaller orifice diameter in view of the need to discharge micro droplets. In this case, the following problems occur. The flow resistance of the ink in a micro discharge port and a discharge portion continuing therefrom is increased, adversely affecting the ink discharge. Also, there is an increase in the recovery (re-filling of ink) speed. In addition, when the viscosity of ink increases due to evaporation of the ink from the orifice in a standby mode, no discharge may occur at the initial stage of the discharge.

A known method for controlling the flow resistance and ink evaporation involves forming a so-called tapered discharge portion, the diameter of which decreases toward the orifice, as disclosed in U.S. Pat. No. 7,048,358.

It may be difficult, however, to desirably form such a tapered discharge portion, especially if its size is small enough to discharge micro droplets.

On the other hand, when the ink re-filling rate is increased, the time required for stabilizing a droplet meniscus on an orifice surface also tends to increase. In particular, this tendency becomes significant in a discharge portion for discharging large droplets. Therefore, a straight discharge portion in which the sectional area parallel to a substrate is the same as the orifice may be preferred according to the size of droplets.

SUMMARY OF THE INVENTION

The present invention provides a liquid discharge head that includes a tapered discharge portion with a high form accuracy. Also, the present invention provides a liquid discharge head that includes different tapered discharge portions or a tapered discharge portion and a straight discharge portion, which are formed on the same substrate.

In accordance with an embodiment of the present invention, there is provided a method for manufacturing a liquid discharge head, which includes an energy generating element that generates the energy utilized for discharging a liquid, a discharge portion provided at a position facing the energy generating element and having an orifice for discharging the liquid, and a passage for supplying the liquid to the discharge portion. The method includes the steps of forming a negative photosensitive resin layer on the substrate so that the absorbance per 1 µm thickness is about 0.02 to about 0.07 at 365 nm, and patterning the layer using an i-line to form the discharge portion so that the sectional area parallel to the substrate gradually decreases from the substrate to the orifice.

In accordance with another embodiment of the present invention, a liquid discharge head includes an energy generating element, which generates energy utilized for discharging a liquid, a discharge portion provided at a position facing the energy generating element and having an orifice for discharging the liquid, and a passage for supplying the liquid to the discharge portion. The discharge portion includes at least a first discharge portion and a second discharge portion, and the second discharge portion has an orifice different from that of the first discharge portion. The sectional area of the second discharge portion parallel to the substrate decreases toward the orifice at a rate greater than that in the first discharge portion, i.e., the second discharge portion is more tapered.

The method of manufacturing a liquid discharge head in accordance with the present invention is capable of providing a liquid discharge head having a tapered discharge portion with a high form accuracy. The liquid discharge head with discharge portions formed on the same substrate and each having an optimum shape according to the discharge volume is capable of more effectively discharging a liquid.

Other features of the present invention will become apparent from the following description of exemplary embodiments with reference to the attached drawings.

BRIEF DESCRIPTION OF THE DRAWINGS

FIGS. 3A to 3J are schematic sectional views showing an example of a method for manufacturing an ink jet recording head according to an embodiment of the present invention.

FIG. 4 shows examples of compounds that can be used in the present invention.

FIG. 13 is a diagram showing a spectrum of illuminating light usable for manufacturing an ink jet recording head according to an embodiment of the present invention.

DESCRIPTION OF THE EMBODIMENTS

Figure 1:
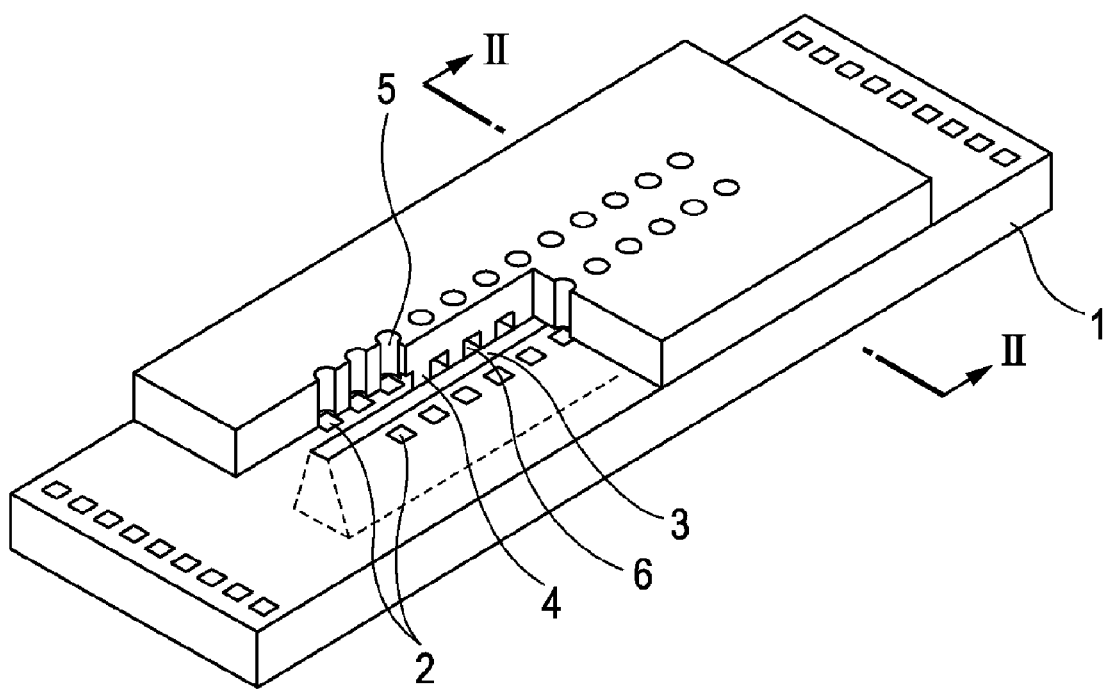
FIG. 1 is a schematic perspective view of an ink jet recording head according to an embodiment of the present invention.

Embodiments of the present invention are described below with reference to the drawings. In this description, components having the same function are denoted by the same reference numerals, and the description of such components may be omitted.

It should be understood that an ink jet recording head is described as a non-limiting example of a liquid discharge head, and that the present invention is not limited thereto. The present invention can be used to form biochips, in the field of electronic circuit printing, and the like.

First, an ink jet recording head (hereinafter, referred to as a "recording head"), which can be formed in accordance with the present invention, is described below.

FIG. 1 is a schematic perspective view of a recording head according to an embodiment of the present invention.

This recording head includes a substrate 1 on which energy generating elements 2, which generate energy used for discharging ink, are formed at a predetermined pitch. Also, a supply port 3 for supplying ink is formed between two rows of the energy generating elements 2 on the substrate 1. Further, a discharge port 5 opening above each of the energy generating elements 2 and an ink passage 6 communicating with each discharge port 5 from the supply port 3 are formed on the substrate 1 using a passage forming member 4.

The recording head is disposed so that the surface where the discharge ports 5 are formed faces a recording surface of a recording medium. In the recording head, pressure generated by the energy generating elements 2 is applied to the ink filled in each of the passages through the ink supply port 3 to discharge ink droplets from the discharge ports 5, and the droplets are allowed to adhere to the recording medium to perform the recording.

Next, the structural characteristics of the recording head are described with reference to FIGS. 2A to 2C.

Figure 2A:
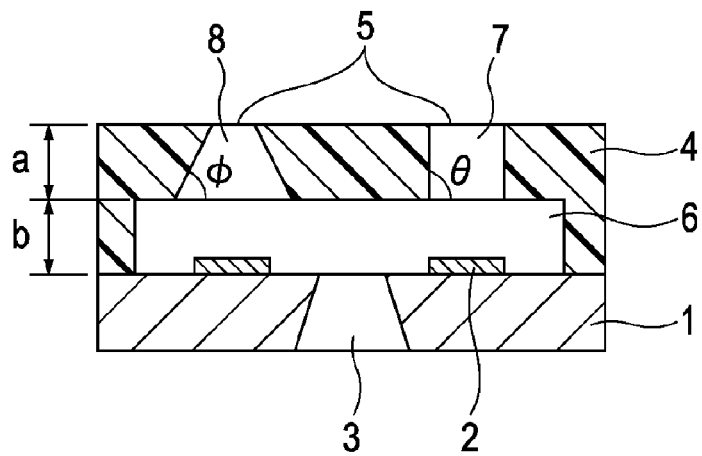
FIGS. 2A to 2C are schematic sectional views, each showing an ink jet recording head according to an embodiment of the present invention.
Figure 2B:
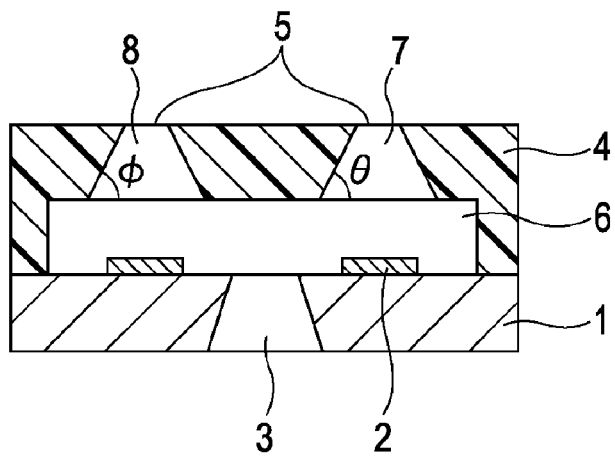
Figure 2C:
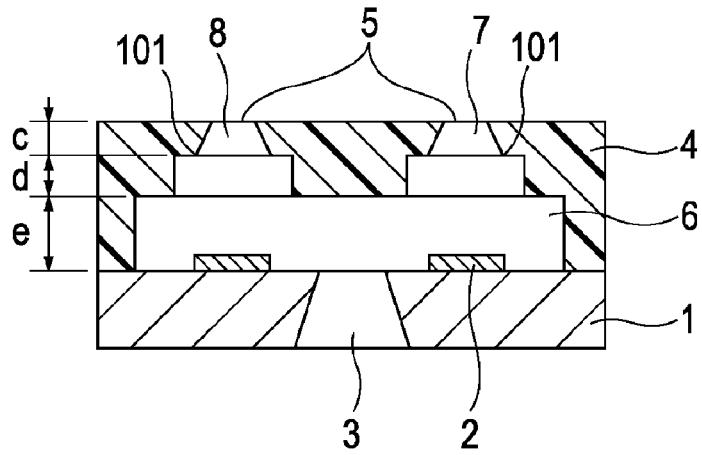

FIGS. 2A to 2C are schematic sectional views each showing a recording head according to an embodiment of the present invention taken along line II-II in FIG. 1.

FIG. 2A shows a recording head including discharge portions 7 and 8 continuing to respective discharge ports 5. In each of the discharge portions 7 and 8, the discharge port 5 has an opening in a direction opposite to the substrate side. The first discharge portion 7 has a straight shape in which the sectional area parallel to the substrate 1 is substantially constant from the discharge port 5 to the substrate side. The second discharge portion 8 has a tapered shape in which the sectional area gradually decreases closer to the discharge port 5. As the taper angle, $\phi$ is preferably 75° to 85° but may be smaller than 75° C. The term "straight shape" represents that $\theta$ is about 90±2° C.

The recording head having the above-described shape can be preferably used when the droplets discharged from the first discharge portion 7 are larger than those discharged from the second discharge portion 8.

As shown in FIG. 2B, the first discharge portion 7 may have a tapered shape. In this case, various angles of taper inclination of the first discharge portion 7 may be selected. For example, angle $\theta$ of the first discharge portion 7 may be larger than angle $\phi$ of the second discharge portion 8 at the same position. In this case, the first discharge portion 7 is less tapered than the second discharge portion 8. Angles $\theta$ and $\phi$ may be the same.

Further, as shown in FIG. 2C, both or either (not shown) of the first and second discharge portions 7 and 8 may be such that the sectional area parallel to the substrate 1 remains constant closer to the substrate. Then, this area decreases at a local point 101 as a boundary and further gradually decreases closer to the discharge port 5. Namely, a discharge portion may have a tapered shape with a so-called step.

Next, a method for manufacturing a recording head according to an embodiment of the present invention is described with reference to FIGS. 3A to 3J. These figures are schematic sectional views showing an example of the method for manufacturing the recording head, taken along line II-II in a completed state as in FIG. 1.

First, as shown in FIG. 3A, the substrate 1 is prepared. The shape of the substrate 1 and the material from which it made are not particularly limited, as long as the substrate can function as a portion of the passage forming member and as a support for a material layer, which forms the passages and the ink discharge ports. In this example, a silicon substrate is used in order to form the ink supply port, which passes through the substrate 1, by anisotropic etching described below.

As shown in FIG. 3B, a desired number of electrothermal transducers or piezoelectric elements are disposed as the energy generating elements 2 on the substrate 1. The energy generating elements 2 apply energy to ink to discharge ink droplets for recording. For example, when electrothermal transducers are used as the energy generating elements 2, a recording liquid is heated by the transducers to cause a change in the state of the ink and to generate discharge energy. For example, when piezoelectric elements are used, discharge energy is generated by mechanical vibrations of the elements. Further, a control signal input electrode (not shown) is connected to the energy generating elements 2 for operating these elements 2.

In addition, various functional layers, such as a protective layer (not shown) for improving the durability of the energy generating elements 2 and an adhesion improving layer (not shown) for improving adhesion between the passage forming member and the substrate, are generally provided. In the present invention, these functional layers can be provided without causing any problems.

Next, as shown in FIG. 3C, a positive photosensitive resin layer 9 is formed on the substrate 1 and the energy generating elements 2.

Next, as shown in FIG. 3D, the positive photosensitive resin layer 9 is patterned by photolithography to form a pattern 10 as an ink passage pattern. Since the pattern 10 must be subsequently removed, for example by being dissolved later in the process, a soluble positive photosensitive resin is used. In particular, a vinyl ketone or acrylic photodegradable polymer compound, such as polymethyl isopropenyl ketone or polyvinyl ketone, can be used. The positive resist layer can be formed by a general-purpose solvent coating method, such as spin coating or slit coating.

Next, as shown in FIG. 3E, a negative photosensitive resin layer 11 is formed on the substrate 1 on which the pattern 10 has been formed. A preferable negative photosensitive resin is described below. The resin layer 11 may be formed, for example, by methods such as spin coating, roll coating, or slit coating.

Although, in this embodiment, the pattern used as the passage pattern is provided, it is not an essential component. In accordance with the present invention, the passages may be formed without using such a pattern.

Next, as shown in FIG. 3F, if required, an ink repellent layer 12 having a negative photosensitivity is formed on the layer 11. The ink repellent layer 12 can be formed by an application method, such as spin coating, roll coating, or slit coating. However, in this example, the ink repellent layer 12 is formed on the uncured negative photosensitive resin layer 11, and thus, both layers are preferably not excessively compatible with each other.

Next, as shown in FIG. 3G, the negative photosensitive resin layer 11 is patterned by exposure through a mask (not shown) and development to form tapered discharge portions. As the taper angle, $\phi$ is preferably 75° to 85° but may be smaller than 75° C. As a result, the passage forming member 4 is formed.

When an ink jet recording head includes a tapered discharge portion and a straight discharge portion, which are formed on the same substrate, the tapered discharge portion 8 and the straight discharge portion 7 may be formed. The term "straight shape" represents that $\theta$ is about 90±2° C. The tapered discharge portion and the straight discharge portion can be separately formed by an exposure method in which the focus amount of the negative photosensitive resin layer 11 is changed using, for example, a so-called stepper (not shown) as an exposure apparatus. According to another method, exposure is performed a plurality of times using a plurality of exposure apparatuses having different irradiation wavelengths. According to still another method, exposure is performed a plurality of times using an exposure apparatus to irradiate wide-band light through a plurality of photomasks, which selectively transmit light in different wavelength regions. Another method can be used in which exposure is performed using an exposure apparatus for irradiation with wide-band light through a photomask provided with a plurality of band-pass filters, which selectively transmit light in different wavelength regions. These methods will be specifically described below with reference to Examples.

In order to form a satisfactory taper shape, it is effective to control the transmittance and exposure amount of the negative photosensitive resin layer 11 at an exposure wavelength to attenuate the photoreaction accompanying exposure in the thickness direction. However, when attenuation in the thickness direction is excessively small, a taper with a satisfactory shape cannot be formed. When the attenuation is excessively large, curing in the coating resin tends to be insufficient closer to the substrate surface, thereby decreasing the mechanical strength, ink resistance, and adhesion to the substrate. In some cases, a straight shape cannot be formed.

On the other hand, in view of the mechanical strength of a cured product as a constituent material and ink resistance and resolution when used as a recording head, a photocationic polymerizable epoxy resin composition is preferably used for the negative photosensitive resin layer 11. In particular, a photocationic polymerizable epoxy resin composition containing, as a base, a bisphenol A epoxy resin, a phenol novolac or cresol novolac epoxy resin, or a polyfunctional epoxy resin having an oxycyclohexane skeleton can be used. In such an epoxy compound, the epoxy equivalent is preferably 2000 or less and more preferably 1000 or less. This is because when the epoxy equivalent exceeds 2000, the cross-link density may be decreased in the curing reaction, thereby causing a problem with adhesion and ink resistance.

An aromatic sulfonium salt or an aromatic iodonium salt is preferably used as a photocationic polymerization initiator for curing the epoxy resin. In particular, an initiator containing antimony as an anionic component is preferably used because of its high reactivity. Examples of the antimony-containing photocationic polymerization initiator include compounds represented by formulae (1) to (10) shown in FIG. 4 and formulae (11) to (13) shown in FIG. 5. Since the antimony-containing photocationic polymerization initiator exhibits excellent polymerization properties for epoxy resins, the reaction product (cured product) has excellent physical properties. The sensitization wavelength for effecting cationic polymerization is in a relatively short wavelength region. Therefore, for example, when patterning is performed using light at a wavelength of about 300 nm or less, relatively high sensitivity is exhibited.

In photocationic polymerization for an epoxy resin, cations (generally protons) derived from the photocationic polymerization initiator are produced by light irradiation, and a ring opening and polymerization reaction of epoxy groups proceeds in a chain polymerization manner. Therefore, the polymerization reaction is effectively initiated with only a small amount of light energy, and thus, the sensitivity of the negative photosensitive resin is significantly increased. The sensitization wavelength (wavelength at which reaction takes place for producing cations) of the photocationic polymerization initiator exemplified in FIG. 4 is mainly in a short-wavelength region of about 300 nm or less.

Figure 5:
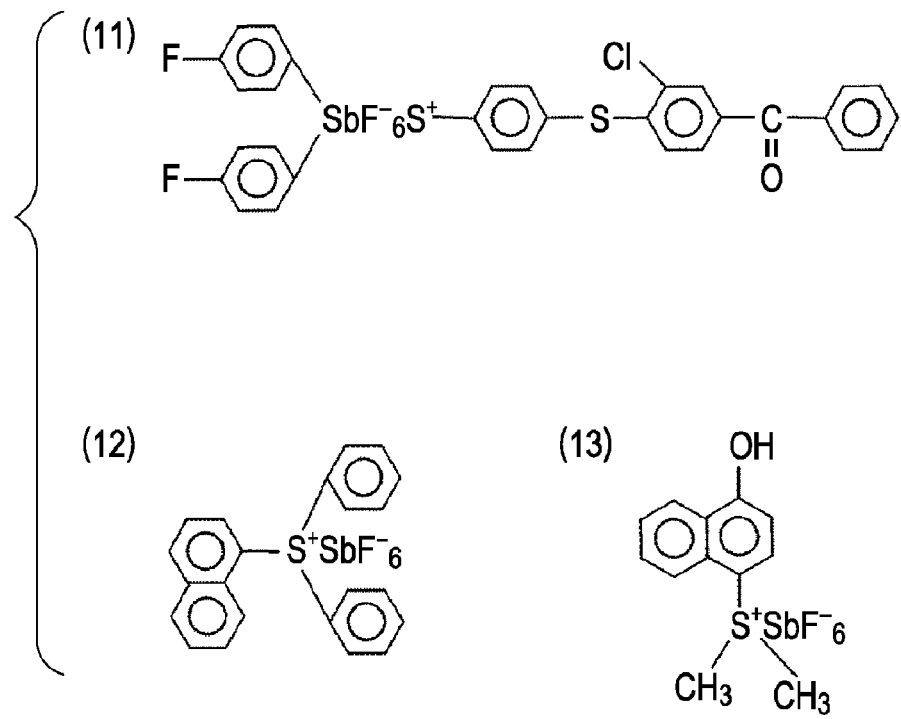
FIG. 5 shows examples of compounds that can be used in the present invention.

On the other hand, the compounds shown in FIG. 5 have a sensitization wavelength up to a relatively long wavelength region. Therefore, in irradiation with the i-line (365 nm), which is generally the wavelength of an exposure apparatus used in photolithography, the use of the above-described compounds allows the resultant polymers to function as preferred negative resists.

Next, a general recording head is described. The amount of the discharged ink is determined by the volumes of the passages 6 and the discharge portions 7 and the amount of energy generated by the energy generating elements. Therefore, in a recording head that discharges micro droplets (about 1 to about 5 pl) required for recent photographic printing, it is necessary to decrease the thickness (a in FIGS. 2A to 2C) of the discharge portions. For example, in the recording head shown in FIG. 2A, in order to discharge ink droplets of about 3 pl, it is preferred that the thickness a of the discharge portion be about 5 to about 10 μm, and the height b of the passage 6 be about 10 to about 15 μm. The recording head shown in FIG. 2C, in which the discharge portions have a two-step shape, is used for discharging micro droplets of about 1 pl. In such a discharge portion, a part where the sectional area parallel to the substrate locally changes is referred to as a local point 101. In such a recording head, when 1 pl droplets are discharged, it is preferred that the thickness c from the local point 101 to the discharge ports 5 be about 3 to about 7 µm, the thickness d from the local point 101 to the substrate be about 3 to about 7 µm, and the height e of the passages be about 10 to about 15 µm.

Figure 6:
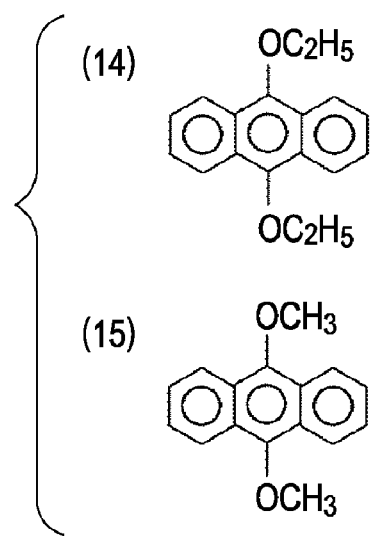
FIG. 6 shows examples of compounds that can be used in the present invention.

In addition, a typical initiator only slightly absorbs light at 365 nm, and an effective method for achieving the attenuation of the photoreaction necessary for forming a taper is to add a compound that absorbs light at 365 nm. Such an additive is not particularly limited, but a polycyclic aromatic compound having a naphthalene or an anthracene skeleton can be preferably used from the viewpoint that strong absorption can be obtained even if a small amount of it is added. A compound with a sensitization effect may be used as the above-described photocationic polymerization initiator. Preferred examples of the compounds with a sensitization effect include anthracene derivatives represented by formulae (14) to (15) shown in FIG. 6.

When the discharge portions having a thickness of about 3 to about 10 µm are formed as described above, as absorption strength for forming a satisfactory taper, the absorbance per 1 µm thickness is preferably in the range of about 0.02 to about 0.07 at 365 nm. When the absorbance per 1 µm thickness is less than about 0.02, little attenuation of the photoreaction occurs in the thickness direction, and thus, substantially no taper is formed. When the absorbance per 1 µm thickness exceeds about 0.07, excessive attenuation of the photoreaction occurs in the thickness direction, and thus, a discharge portion with a desired shape cannot be formed even if the focus in exposure is changed, and defective curing may occur at a lower portion of the photosensitive resin layer.

The above-mentioned theory can be applied to a case in which a wavelength other than the i-line is used for exposure. For example, when exposure of a negative photosensitive resin is performed with light in a short wavelength region having a single peak, the absorbance of the negative photosensitive resin at the peak wavelength can be set from about 0.02 to about 0.07. In this case, light at a wavelength having a single peak represents a laser beam or light at a specified wavelength extracted from wide-band light.

Further, an additive can be included in the above-described composition. For example, a plasticizing agent can be added for decreasing the elastic modulus of the epoxy resin, or a silane coupling agent can be added for obtaining stronger adhesion to a base layer. Since the ink repellent layer 6 is generally formed at an extremely small thickness (about 0.5 µm or less), attenuation of light by the ink repellent layer 6 can be disregarded.

As shown in FIG. 3H, an etching mask 13 composed of a resin that is resistant to the etching solution is formed on the back side of the substrate 1.

Next, as shown in FIG. 3I, the ink supply port 3 is formed by immersion etching in an alkali etching solution, such as an aqueous solution of potassium hydroxide, sodium hydroxide, or tetramethylammonium hydroxide, under heating. In this etching process, as disclosed in Japanese Patent Laid-Open No. 2001-10070, a mask with a two-layer structure including a dielectric layer of silicon oxide or silicon nitride and a resin may be used for preventing defects, such as pin holes. The etching mask may be formed before the positive photosensitive resin layer 9 and the negative photosensitive resin layer 11 are formed.

As shown in FIG. 3J, after a cutting separation step (not shown), the passage pattern 10 is removed by dissolution to form the passages 6, and, if required, the etching mask 13 is removed. Further, if required, the negative photosensitive resin in the passage forming member 4 and the ink-repellent layer 12 are completely cured by the heat treatment. Then, bonding of a member (not shown) for supplying ink and electric bonding (not shown) for driving the energy generating elements are performed to complete the recording head.

The above-described method for manufacturing the recording head is capable of forming a taper with a high level of accuracy and capable of manufacturing, by a simple method with a high level of accuracy, a recording head having tapered and straight discharge portions, which are formed on the same substrate.

Although a method of exposing the negative photosensitive resin on the passage pattern is described above, the present invention is not limited to this method. Another method can be used, in which the negative photosensitive resin is separately exposed to form a passage forming member having tapered discharge portions, and the passage forming member is then bonded to a substrate.

Also, the above-described ink jet recording head includes the energy generating elements and the discharge ports disposed opposite to the respective energy generating elements, the present invention is not limited to this arrangement.

The present invention is described below in further detail with reference to the Examples.

Example 1

Preparation of Negative Photosensitive Resin

A negative photosensitive resin containing the following components was prepared.

| | |
|---|---|
| Epoxy resin: EHPE-3150 (manufactured by Daicel Chemical Industries, Ltd.) | 120 g |
| Photocationic polymerization initiator: SP-172 (manufactured by Asahi Denka Kogyo K. K.) | 6 g |
| Sensitizer: SP-100 (manufactured by Asahi Denka Kogyo K. K.) | 1.2 g |
| Methyl isobutyl ketone | 100 g |

The negative photosensitive resin was applied onto a quartz glass substrate at a thickness of 1 µm. The measured absorbance at 365 nm was 0.024.

Formation of Recording Head

Figure 7:
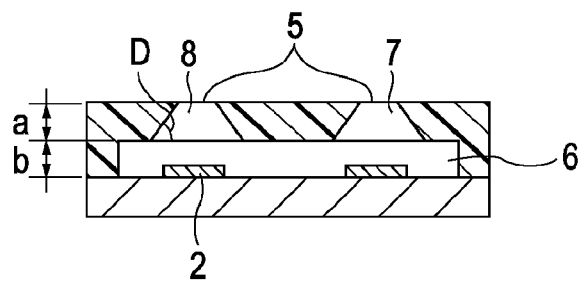
FIG. 7 is a schematic sectional view showing an ink jet recording head according to an embodiment of the present invention.

A recording head shown in FIG. 7 was formed using the negative photosensitive resin.

FIG. 7 is a schematic sectional view of a recording head of Example 1 and corresponds to the sectional views of FIGS. 3A to 3J.

A description with reference to FIGS. 8A to 8F corresponds to the sectional views of FIGS. 3A to 3J.

Figure 8A:
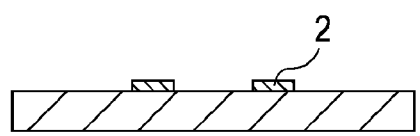
FIGS. 8A to 8F are schematic sectional views showing an example of a method for manufacturing an ink jet recording head according to an embodiment of the present invention.

First, a silicon substrate including electrothermal transducers (heaters composed of $HfB_2$) serving as ink discharge energy generating elements 2 and a SiN/Ta laminated film (not shown) provided at a position where a passage was to be formed were prepared (FIG. 8A).

Next, polymethyl isopropenyl ketone (ODUR manufactured by Tokyo Ohka Kogyo Co., Ltd.) was applied as a positive photosensitive resin 9 by spin coating on the substrate and the energy generating elements 2 and then baked at 150° C. for 3 minutes. The thickness of the resist layer after baking was 15 µm (FIG. 8B).

Then, the positive photosensitive resin 9 was patterned. Pattern exposure was performed using, as an exposure apparatus, Ushio Electric Inc. Deep-UV exposure apparatus UX-3000, with an exposure amount of 23,000 mJ/cm$^2$, followed by development with methyl isobutyl ketone and rinsing with isopropyl alcohol. As a result, a passage pattern 10 having a height of 15 μm was formed (corresponding to b in FIG. 8C and FIG. 7) (FIG. 8C).

Figure 8D:
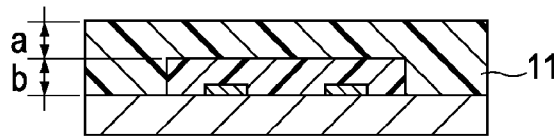
Figure 8B:
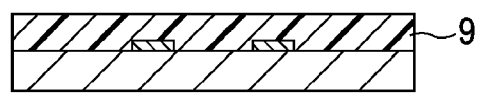

Next, the negative photosensitive resin 11 prepared as described above was applied on the substrate by spin coating (FIG. 8D). The thickness of the negative photosensitive resin from the substrate was 23 μm (corresponding to (a+b) in FIGS. 7 and 8D), and the thickness at the part where the discharge portion was to be formed was 8 μm (corresponding to a in FIGS. 7 and 8D). In this Example, the formation of an ink repellent layer was omitted.

Figure 8E:
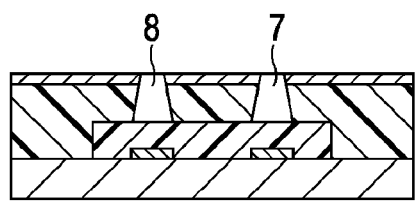
Figure 8C:
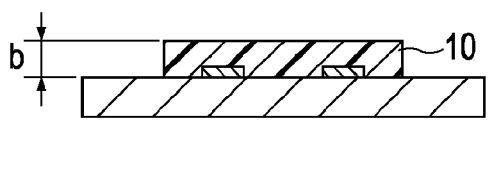

Next, the negative photosensitive resin 11 was patterned. Pattern exposure was performed using an i-line stepper (manufactured by Canon) through a photomask (not shown) with a defocusing amount of −15 μm (at a position of 15 μm from the surface of the negative photosensitive resin 11 to the substrate 1) and an exposure amount of 1000 J/m$^2$ at a central wavelength of 365 nm with a half bandwidth (full width at half maximum) of 5 nm. Then, baking on a hot plate at 90° C. for 180 seconds, development with methyl isobutyl ketone, rinsing with isopropyl alcohol, and heat treatment at 100° C. for 60 minutes were performed. In this Example, first and second discharge portions 7 and 8, each having a discharge port 5 of 10 μm in diameter, were formed (FIG. 8E). Also, the member constituting the discharge portions 7 and 8 was integrated with the passage forming member 4.

Figure 8F:
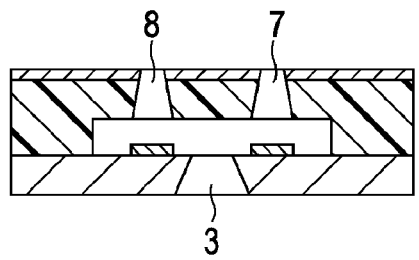

The entire exposure was performed using Ushio Electric Inc. Deep-UV exposure apparatus UX-3000, which is the same as that used for patterning the positive resin, at an exposure amount of 250,000 mJ/cm$^2$ through the negative photosensitive resin to solubilize the passage pattern 10. Then, the substrate was immersed in methyl lactate and subjected to ultrasonic waves to remove the passage pattern 10 by dissolution (FIG. 8F).

The formation of the supply port 3 is not described.

As a result of an electron microscope observation of sections of the discharge portions in the simulated recording head formed as described above, each of the discharge portions had a taper angle (D in FIG. 7) of 80°. Also, deformations, such as roundness, were not observed at the edges of the discharge ports 5, and thus, the discharge ports 5 were satisfactory.

In this Example, the first and second discharge portions 7 and 8 had the same shape.

Example 2

A recording head of Example 2 in accordance with the present invention is described with reference to FIGS. 9A and 9B.

Figure 9A:
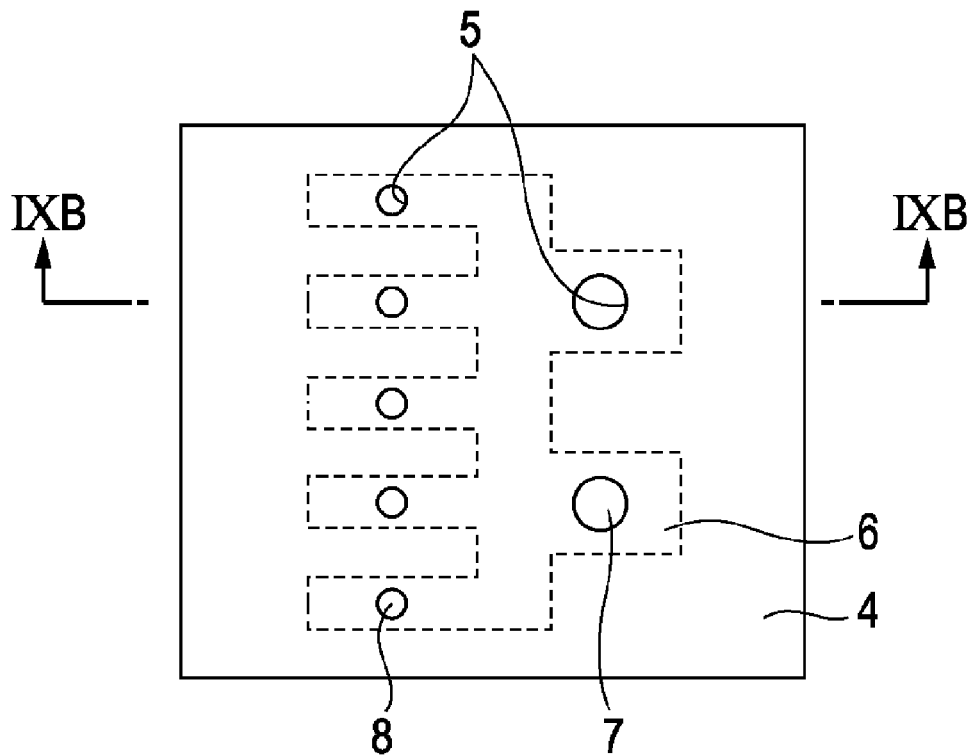
FIGS. 9A and 9B are, respectively, a plan view and a schematic sectional view of an ink jet recording head according to an embodiment of the present invention.

FIG. 9A schematically shows the recording head of Example 2 of the present invention as viewed in a direction from discharge ports 5 to a substrate 1. FIG. 9B is a schematic sectional view perpendicular to the substrate 1, taken along line IXB-IXB in FIG. 9A.

In this embodiment, the discharge head had tapered discharge portions 8 and straight discharge portions 7, which were formed in the same discharge portion forming member (a portion of a passage forming member 4 in this example).

A method for manufacturing the recording head of Example 2 is described below.

The production steps up to the one shown in FIG. 8D were the same as in Example 1, and the negative photosensitive resin 11 used was the same as in Example 1.

Figure 10A:
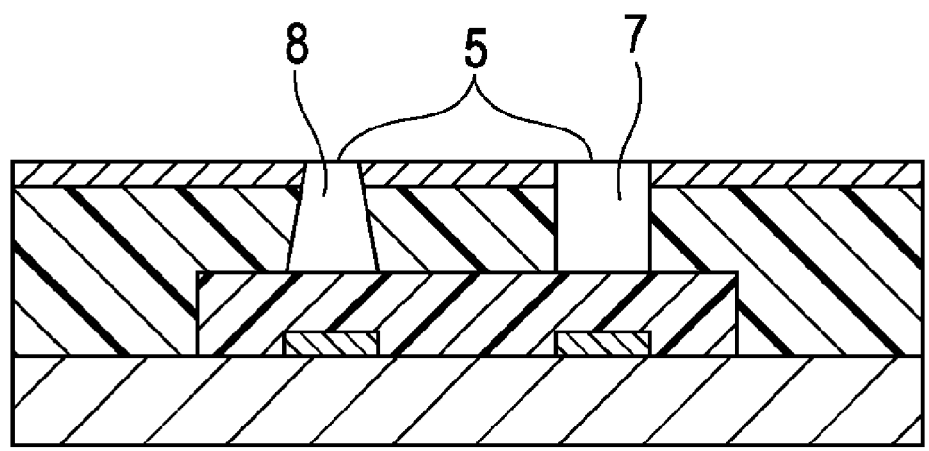
FIGS. 10A and 10B are schematic sectional views showing an example of a method for manufacturing an ink jet recording head according to an embodiment of the present invention.
Figure 10B:
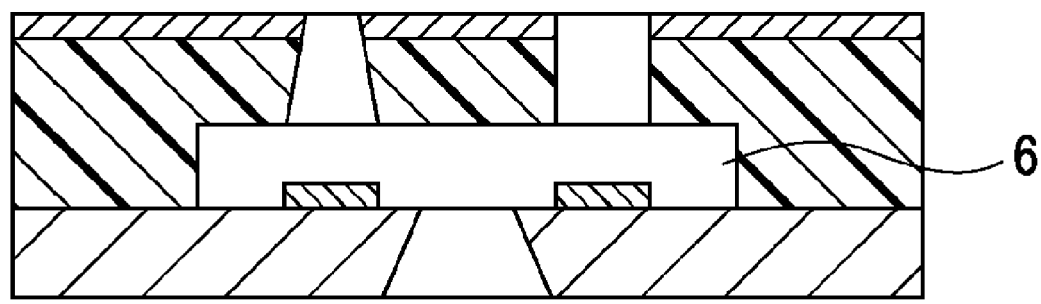

Subsequent steps are described below with reference to FIGS. 10A and 10B.

Pattern exposure was performed using an i-line stepper (manufactured by Canon) through a first photomask (not shown), which was disposed to correspond to a portion where the tapered discharge portions 8 were to be formed, with a defocusing amount of −15 μm (at a position of 15 μm from the surface of the negative photosensitive resin 11 to the substrate 1) at a central wavelength of 365 nm with a half bandwidth (full width at half maximum) of 5 nm. The exposure amount was 1000 J/m$^2$. Then, pattern exposure was performed through a second photomask (not shown), which was disposed to correspond to a portion where the straight discharge portions 7 were to be formed while focusing on the surface of the negative photosensitive resin 11 with an exposure amount of 1000 J/m$^2$. Then, baking on a hot plate at 90° C. for 180 seconds, development with methyl isobutyl ketone, rinsing with isopropyl alcohol, and a heat treatment at 100° C. for 60 minutes were performed (FIG. 10A). Next, a passage pattern was removed by the same method as in Example 1, and then a supply port was formed (FIG. 10B).

In this Example, a discharge port 5 with a 10 μm diameter was formed in each tapered discharge portion 8, and a discharge port 5 with a 15 μm diameter was formed in each straight discharge portion 7.

As a result of an electron microscope observation of sections of the discharge portions in the recording head formed as described above, each of the tapered discharge portions 8 had a taper angle E of 80°, and each of the straight discharge portions 7 had a side wall at an angle F of 90°, i.e., perpendicular to the substrate. Also, deformations, such as roundness, were not observed at the edges of the discharge ports 5, and thus, the discharge ports 5 were satisfactory.

Example 3

Preparation of Negative Photosensitive Resin

A negative photosensitive resin containing the following components was prepared.

| | |
|---|---|
| Epoxy resin: EHPE-3150 (manufactured by Daicel Chemical Industries, Ltd.) | 120 g |
| Photocationic polymerization initiator: SP-172 (manufactured by Asahi Denka Kogyo K. K.) | 6 g |
| Sensitizer: SP-100 (manufactured by Asahi Denka Kogyo K. K.) | 1.5 g |
| Methyl isobutyl ketone | 100 g |

The negative photosensitive resin was applied onto a quartz glass substrate at a thickness of 1 μm. The measured absorbance at 365 nm was 0.030.

Figure 9B:
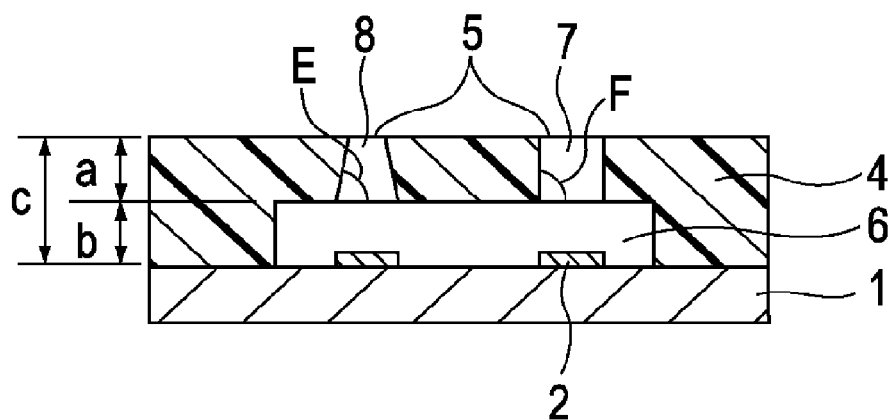

The recording head shown in FIGS. 9A and 9B was formed by the same method as in Example 2 using the above-described negative photosensitive resin.

Formation of Recording Head

In this Example, the thickness of the negative photosensitive resin 11 from the top of the substrate was 20 μm ((a+b) in FIG. 8D) and the thickness from the top of the passage pattern 6 was 5 μm (a in FIG. 8D).

As a result of an electron microscope observation of sections of the discharge portions in the recording head formed in this Example, each of the tapered discharge portions 8 had a taper angle E of 82° and each of the straight discharge portions 7 had a side wall at an angle F of 90°, i.e., perpendicular to the substrate. Also, deformations were not observed at the edges of the discharge ports.

Comparative Example 1

A recording head was formed by the same method as in Example 1, except that a negative photosensitive resin 11 not containing a sensitizer was used, and the exposure amount of the negative photosensitive resin 11 was 2000 J/m². The measured absorbance at 365 nm of the negative photosensitive resin 11 not containing a sensitizer was 0.0016.

As a result of an electron microscope observation of sections of the discharge portions in the resulting recording head, the angle D was 90° and a tapered discharge portion was not formed.

Comparative Example 2

A recording head was formed by the same method as in Example 1, except that the amount of the sensitizer added to the negative photosensitive resin 11 was 3.9 g. The measured absorbance at 365 nm of the negative photosensitive resin 11 was 0.078.

In this Comparative Example, even when the exposure amount was increased, the negative photosensitive resin was not completely cured, thereby causing separation to occur during the development process.

In addition to the above-described Examples and Comparative Examples, a recording head was formed by the same method as in Example 1, except that the amount of the sensitizer (SP-100) added was changed to alter the absorbance of the negative photosensitive resin at 365 nm. The results of the evaluation of the shapes of the discharge portions in the recording heads are summarized in Tables 1 and 2. In each of the examples below, the focal position was also changed (−15 µm and 0 µm from the surface of the negative photosensitive resin) in the exposure. The other conditions were the same as in Example 1.

TABLE 1

(thickness a (refer to FIG. 8D) of 8 µm in the part where the discharge portions were formed)

| Absorbance of negative photosensitive resin (per µm at 365 nm) | Focus = −15 µm | | Focus = 0 µm | |
|---|---|---|---|---|
| | Angle (°) | Sectional shape | Angle (°) | Sectional shape |
| 0.0016 | 90 (#1) | Good (#1) | 90 | Excellent |
| 0.018 | 88 | Excellent | 90 | Excellent |
| 0.020 | 83 | Excellent | 90 | Excellent |
| 0.024 | 80 (*1, 2) | Excellent (*1, 2) | 90 (*2) | Excellent (*2) |
| 0.030 | 78 | Excellent | 90 | Excellent |
| 0.048 | 75 | Excellent | 88 | Good |
| 0.060 | 73 | Good | 88 | Good |
| 0.070 | 72 | Good | 87 | Good |
| 0.072 | Non-resolvable | Poor | 87 | Good |
| 0.078 | Insufficient curing (#2) | | Insufficient curing | |

*1 Example 1 (focus −15 µm),
*2 Example 2 (formation of tapered and straight shapes)
1 Comparative Example 1,
2 Comparative Example 2

TABLE 2

(thickness a (refer to FIG. 8D) of 5 µm in the part where the discharge portions were formed)

| Absorbance of negative photosensitive resin (per µm at 365 nm) | Focus = −15 µm | | Focus = 0 µm | |
|---|---|---|---|---|
| | Angle (°) | Sectional shape | Angle (°) | Sectional shape |
| 0.0016 | 90 | Good | 90 | Excellent |
| 0.018 | 88 | Good | 90 | Excellent |
| 0.020 | 84 | Excellent | 90 | Excellent |
| 0.024 | 83 | Excellent | 90 | Excellent |
| 0.030 | 82 (*3) | Excellent | 90 | Excellent |
| 0.048 | 77 | Excellent | 89 | Good |
| 0.060 | 75 | Good | 89 | Good |
| 0.070 | 74 | Good | 88 | Good |
| 0.072 | Non-resolvable | Poor | 87 | Good |
| 0.078 | Non-resolvable | Poor | 87 | Poor |

*3 Example 3 (focus −15 µm)

In the tables, the angle corresponds to angle D shown in FIG. 7 or angle E or F shown in FIG. 9B. The sectional shapes of the discharge portions were evaluated on the basis of the following criteria:

Excellent: A discharge port had an acute-angle or right-angle edge portion.

Good: A discharge port had a slightly rounded edge portion with no problems related to the discharge.

Poor: A discharge port had a rounded edge portion, and a discharge portion was distorted over the entire shape thereof. The term "Non-resolvable" means that patterning into the shape of a discharge portion was impossible. Also, "Insufficient curing" means that the negative photosensitive resin was not sufficiently cured, resulting in separation from the substrate.

Regardless of the thickness, when the absorbance is 0.18, the angle is 88°, and the discharge portions have a substantially straight shape. While when the absorbance is about 0.02 or more, the angle is 84° and the discharge portions have a tapered shape. This is possibly because the i-line is sufficiently absorbed in the region from the surface to a deep position of the negative photosensitive resin. Thus, the curing reaction sufficiently proceeds. When the absorbance exceeds about 0.07, it is thought that light absorption is excessively strong, and light required for the curing reaction does not reach the entire region of the negative photosensitive resin.

As a result, it is found that in order for a discharge portion with a good tapered shape to be formed by the i-line exposure of the negative photosensitive resin, the absorbance per 1 µm thickness of the negative photosensitive resin should preferably be about 0.02 to about 0.07 at 365 nm. Within this range, shapes from a straight shape at an angle of 90° and a substantially straight shape at an angle of about 88° can be formed. Therefore, a tapered discharge portion and a straight discharge portion can be formed in the same resin by the i-line exposure of the negative photosensitive resin having an absorbance per 1 µm thickness of about 0.02 to about 0.07 at 365 nm.

Example 4

In this Example, exposure for forming a different tapered discharge portion and a straight discharge portion was carried out using respective masks.

Preparation of Negative Photosensitive Resin

A negative photosensitive resin A containing the following components was prepared.

| | |
|---|---|
| Epoxy resin: EHPE-3150 (manufactured by Daicel Chemical Industries, Ltd.) | 100 parts by weight |
| Photocationic polymerization initiator: SP-172 (manufactured by Asahi Denka Kogyo K. K.) | 2 parts by weight |
| Methyl isobutyl ketone | 100 parts by weight |

Figure 11:
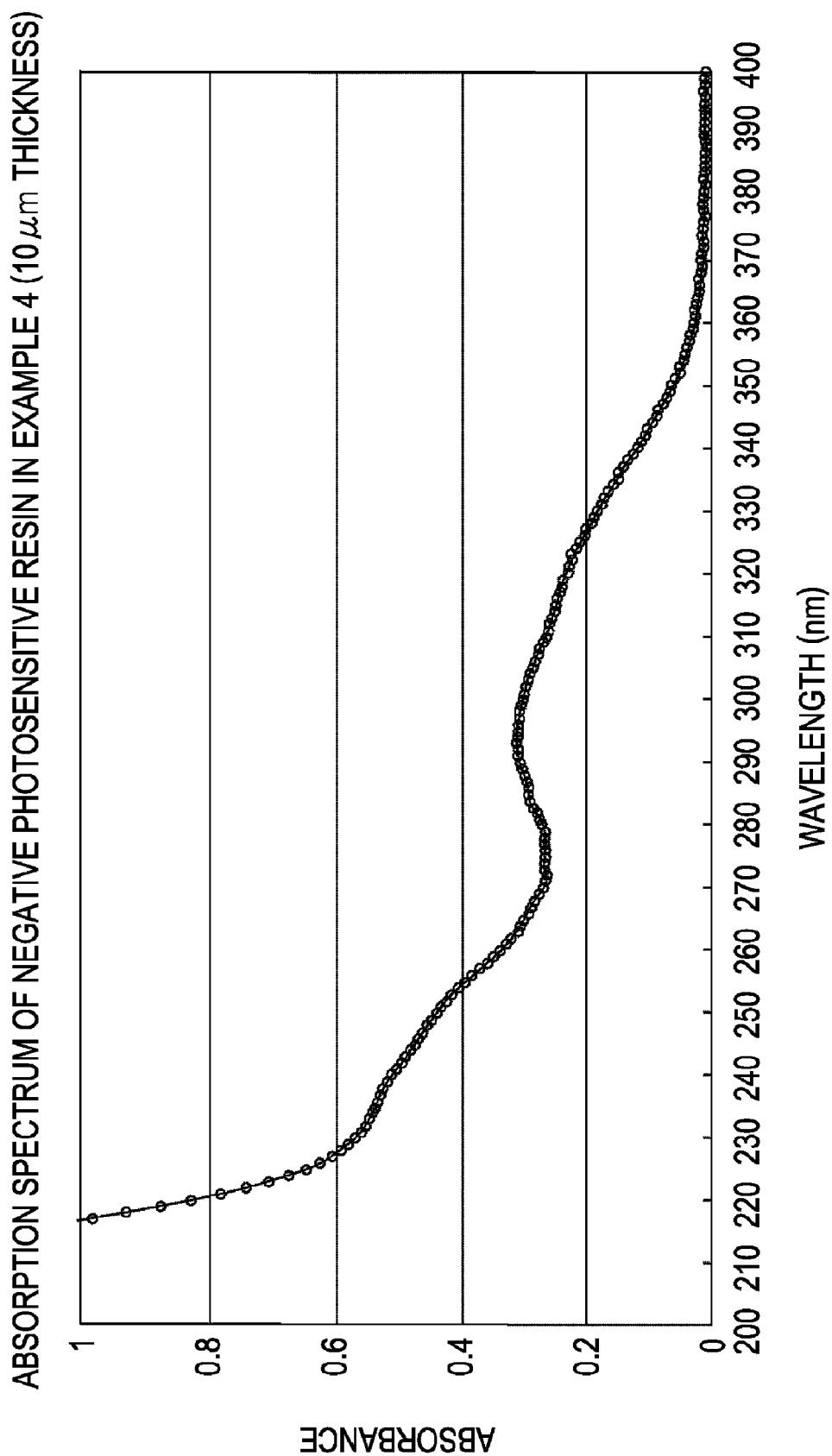
FIG. 11 is a diagram showing a light absorption spectrum of a negative photosensitive resin used for manufacturing an ink jet recording head according to an embodiment of the present invention.

A UV absorption spectrum of the negative photosensitive resin A with a thickness of 10 μm is shown in FIG. 11. The spectrum demonstrates that the resin A absorbs light shorter than about 370 nm due to the photocationic polymerization initiator.

Formation of Recording Head

The recording head shown in FIGS. 9A and 9B was formed. FIG. 9A is a schematic view of the recording head as viewed in a direction from discharge ports 5 to a substrate 1. FIG. 9B is a schematic sectional view perpendicular to the substrate 1, taken along line IXB-IXB in FIG. 9A. The method for manufacturing this recording head is described below with reference to FIGS. 12A and 12B.

The process steps up to the one shown in FIG. 8D were performed as in Example 1. However, it should be noted that in Example 4, resin A was used as the negative photosensitive resin 11, the thickness b of the passage pattern 6 was 10 μm, the thickness of the negative photosensitive resin 11 from the substrate 1 was 20 μm (a+b=c), and the thickness in a portion where the discharge portions were formed was 10 μm (a in FIG. 9B).

In this example, the formation of an ink repellent layer was omitted.

Figure 12A:
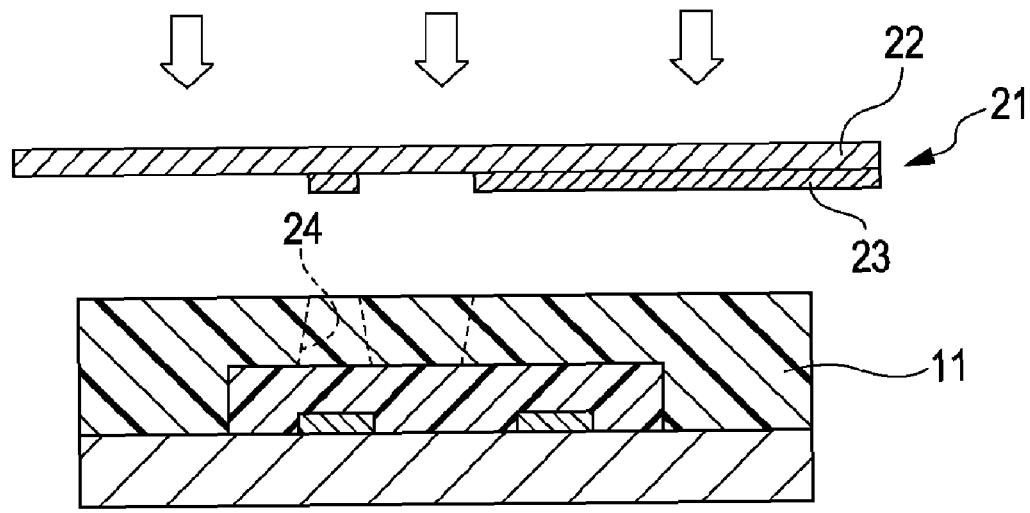
FIGS. 12A and 12B are schematic sectional views showing an example of a method for manufacturing an ink jet recording head according to an embodiment of the present invention.

Next, the negative photosensitive resin 11 was patterned. First, in a portion 24, where tapered discharge portions were to be formed, pattern exposure was performed using a KrF excimer laser (248 nm) stepper (manufactured by Canon) through a first photomask 21 with an exposure amount of 480 J/m$^2$ (FIG. 12A). In FIG. 12A, reference numeral 23 denotes a light shielding portion. Reference numeral 22 denotes a quartz glass substrate of the mask 21.

Figure 12B:
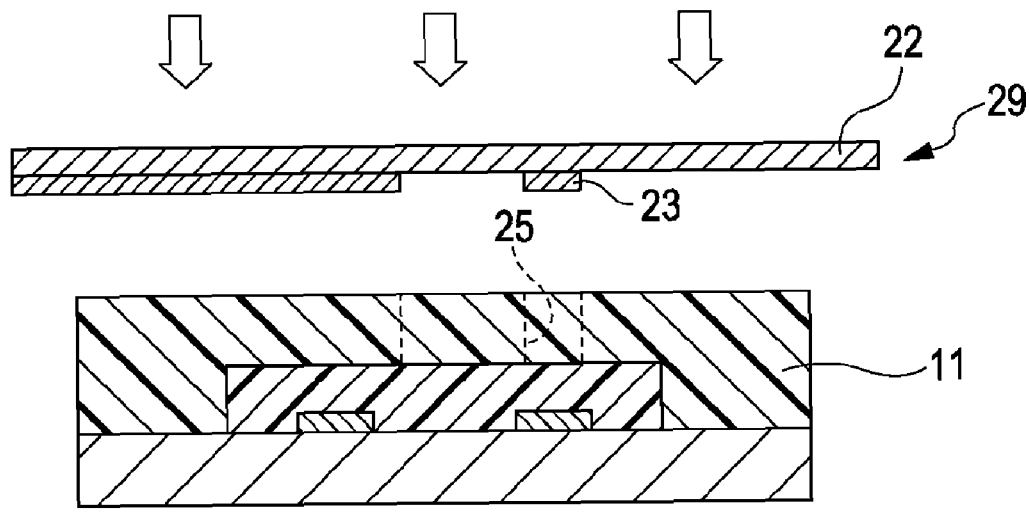

Then, in a portion 25 where straight discharge portions were to be formed, pattern exposure was performed using an i-line stepper (manufactured by Canon) through a second photomask 29 with an exposure amount of 500 J/m$^2$. Since the resin had only a weak absorption near 365 nm, the irradiated light (i-line) caused a uniform reaction of the negative photosensitive resin with substantially no attenuation to form a latent image of the straight discharge portions in the resist film (FIG. 12B).

Then, PEB (post exposed baking) was conducted on a hot plate at 90° C. for 180 seconds. Next, development with methyl isobutyl ketone, rinsing with isopropyl alcohol, and a heat treatment at 100° C. for 60 minutes were performed to form a passage forming member 4. In this Example, a discharge port 5 with a diameter 10 μm was formed in each tapered discharge portion 8, and a discharge port 5 with a diameter of 15 μm was formed in each straight discharge portion 7.

Next, a passage pattern was removed by the same method as in Example 1.

As a result of an electron microscope observation of sections of the discharge portions in the recording head formed as described above, tapered discharge portions 8, each having a taper angle E of 80° (E in FIG. 9B), and straight discharge portions 7 were formed.

Example 5

In this Example, tapered discharge portions and straight discharge portions were formed separately by a plurality of exposures using an exposure apparatus for irradiating wideband light through a plurality of photomasks that selectively transmitted light in different wavelength regions.

The recording head shown in FIGS. 9A and 9B was formed by the same method as in Example 4, and the negative photosensitive resin 11 used was the same as in Example 4. Further, MPA-600 (manufactured by Canon) was used as the exposure apparatus capable of irradiating wide-band light. FIG. 13 shows the irradiation wavelength and irradiation energy of the exposure apparatus.

Steps subsequent to that shown in FIG. 8D are described below.

Figure 14A:
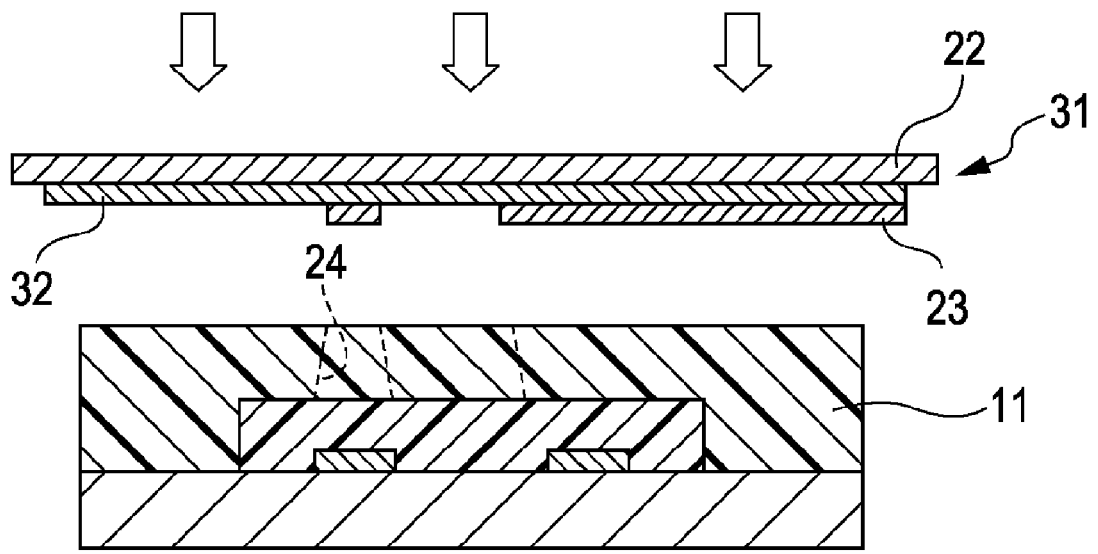
FIGS. 14A and 14B are schematic sectional views showing an example of a method for manufacturing an ink jet recording head according to an embodiment of the present invention.
Figure 15A:
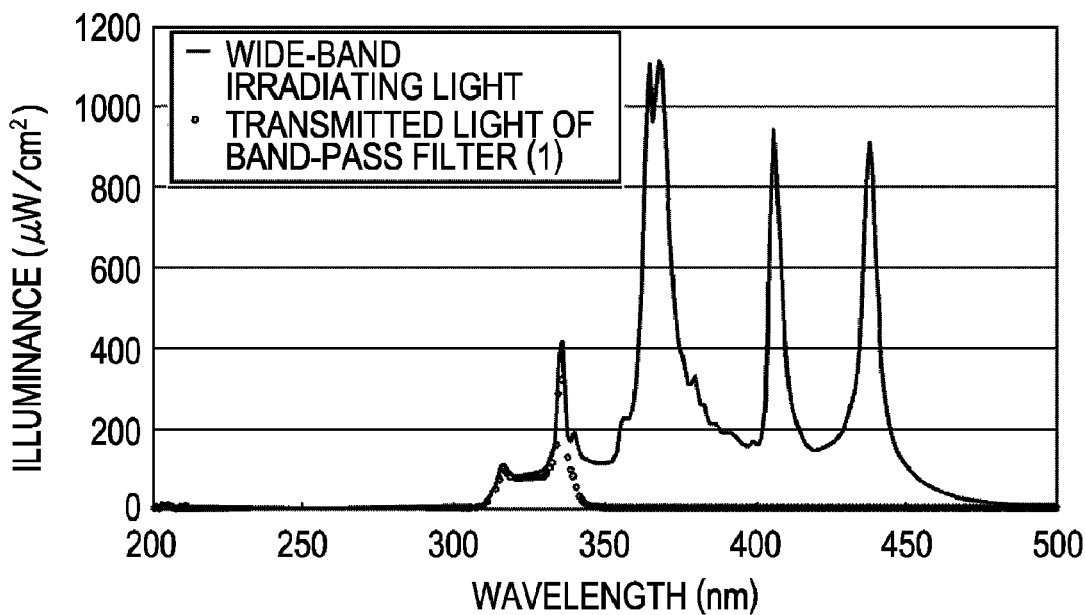
FIGS. 15A and 15B are diagrams, each showing a wavelength region of light, which can be absorbed by a mask used for manufacturing an ink jet recording head according to an embodiment of the present invention.

As shown in FIG. 14A, in a portion 24 where tapered discharge portions were to be formed, exposure was performed through a third photomask 31 provided with a band-pass filter 32 having wavelength selectivity, as shown in FIG. 15A. The exposure amount was 1,000 mJ/cm$^2$ (the exposure time was controlled so that the exposure amount was 1,000 mJ/cm$^2$ with illuminance measured without the band-pass filter). Since the resist has a strong absorption for light transmitted through the band-pass filter 32, a latent image of a tapered discharge portion is formed in the resist film (FIG. 14A).

Figure 14B:
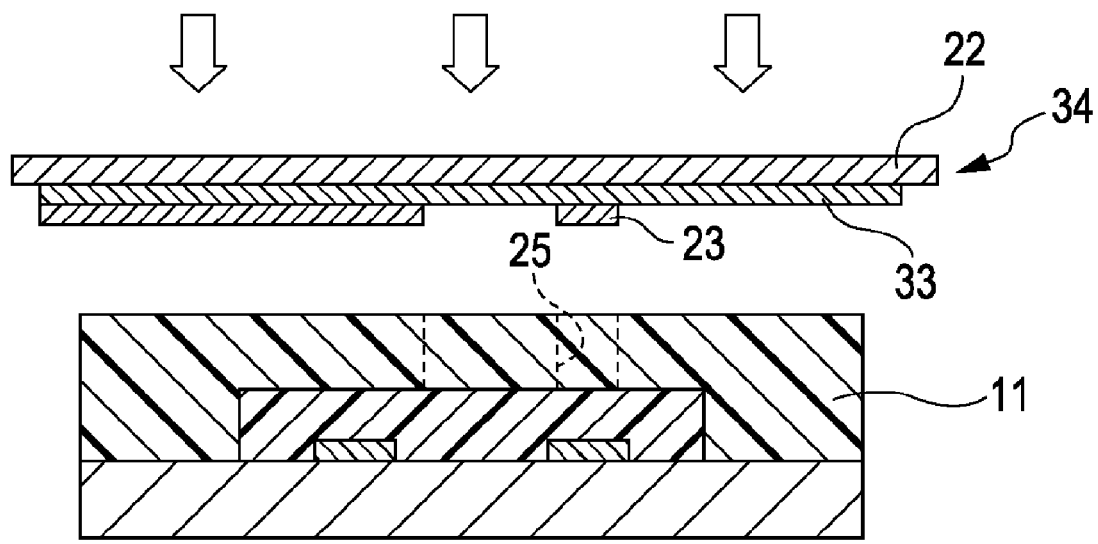
Figure 15B:
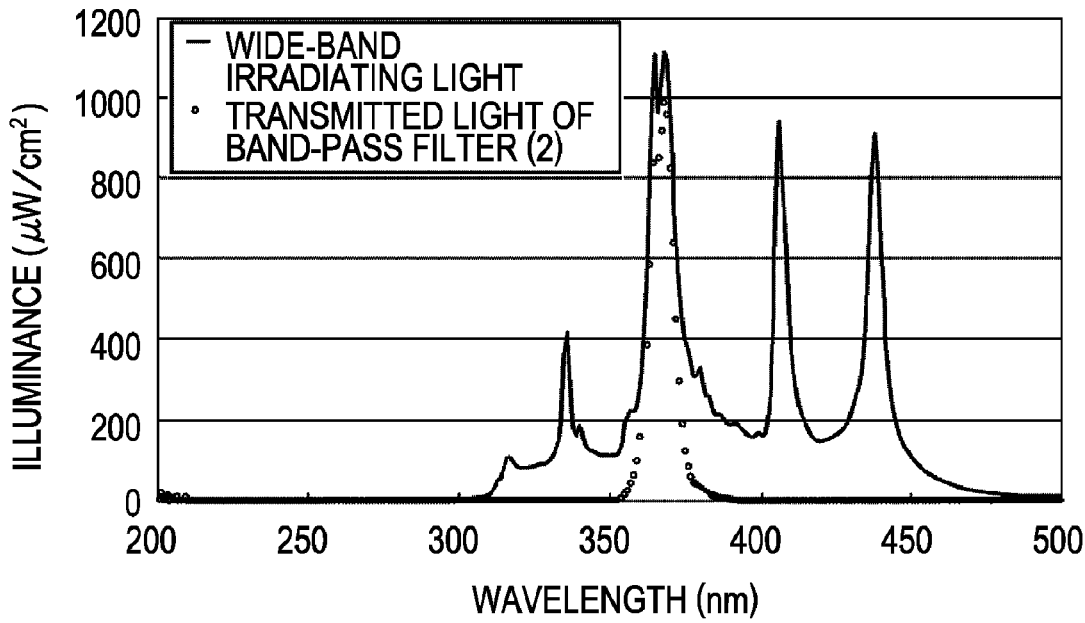

Then, in a portion 25 where straight discharge portions were to be formed, exposure was performed through a fourth photomask 34 with a band-pass filter 33 having wavelength selectivity, as shown in FIG. 15B. The exposure amount was 1000 mJ/cm$^2$ (the exposure time was controlled so that the exposure amount was 1000 mJ/cm$^2$ with illuminance measured without the band-pass filter) (FIG. 14B). Subsequent steps were the same as in Example 4.

In this Example, a discharge port 5 with a diameter of 10 μm was formed in each tapered discharge portion 8, and a discharge port 5 with a diameter of 15 μm was formed in each straight discharge portion 7.

As a result of an electron microscope observation of sections of the simulated discharge portions in the recording head formed as described above, tapered discharge portions 8, each having a taper angle E of 80° (E in FIG. 9B), and straight discharge portions 7 substantially perpendicular to the substrate 1 were formed.

Example 6

In this Example, exposure was performed using an exposure apparatus for irradiating wide-band light through a photomask provided with a plurality of band-pass filters, which selectively transmitted light in different wavelength regions.

The recording head shown in FIGS. 9A and 9B was formed.

The steps up to the one shown in FIG. 8D were performed by the same method as in Example 4, and the negative photosensitive resin used was the same as in Example 4.

Figure 16:
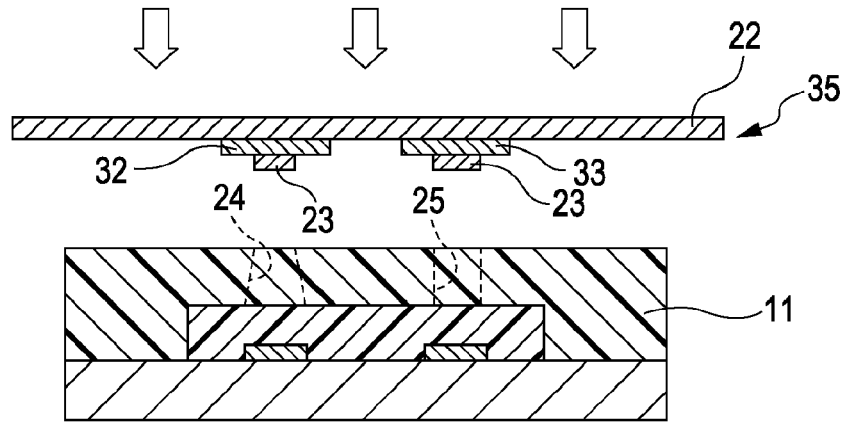
FIG. 16 is a schematic sectional view showing an example of a method for manufacturing an ink jet recording head according to an embodiment of the present invention.

As shown in FIG. 16, in a portion of the negative photosensitive resin 11 where tapered discharge portions were to be formed, pattern exposure was performed using the same exposure apparatus as in Example 5 through a fifth photomask 35. The fifth photomask 35 was provided with a band-pass filter 32 and a band-pass filter 33, which were the same as those used in Example 5. Subsequent steps were the same as in Example 4.

As a result of electron microscope observation of sections of the simulated discharge portions in the recording head formed as described above, tapered discharge portions 8, each having a taper angle of 80° (E in FIG. 9B), and straight discharge portions 7 substantially perpendicular to the substrate 1 were formed.

Example 7

In Example 7, tapered and straight discharge portions were formed by exposure in which the image focal position was changed according to the discharge portions.

The recording head shown in FIGS. 9A and 9B was formed by the method described below.

The steps up to the one shown in FIG. 8D were performed by the same method as in Example 4, and the negative photosensitive resin used was the same as in Example 4.

Figure 17A:
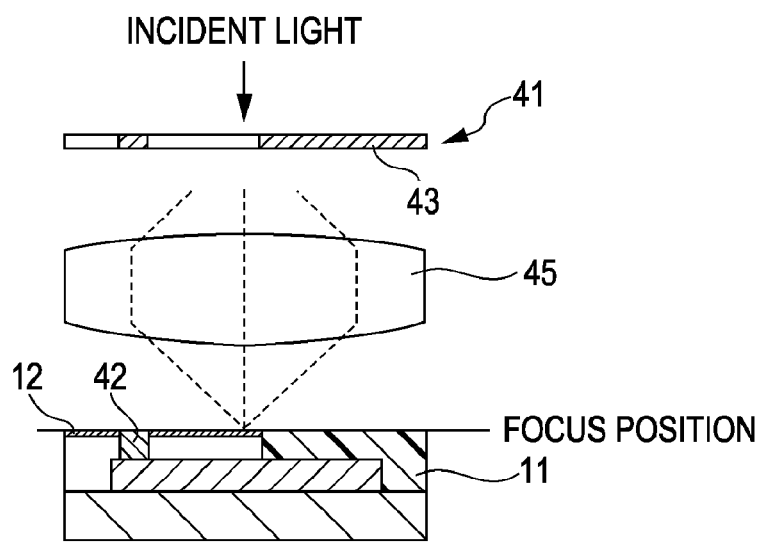
FIGS. 17A and 17B are schematic sectional views showing an example of a method for manufacturing an ink jet recording head according to an embodiment of the present invention.

As shown in FIG. 17A, pattern exposure was performed for forming only straight discharge portions using a mask 41 as described below. Reference numeral 42 denotes a portion where the straight discharge portions were to be formed. In this exposure, a part where the tapered discharge portions were to be formed was shielded with a light shielding film 43. The imaging (focus) position was set at a 0-μm focus position in order to form discharge portions with a straight profile. In this case, the substrate side was set as a minus side and the optical lens side was set as a plus side. A step-and-repeat exposure system KrF excimer laser stepper (FPA-3000EX5, manufactured by Canon) was used as an exposure apparatus, and the exposure amount was 300 J/m$^2$. Reference numeral 45 denotes a projection optical lens.

Figure 17B:
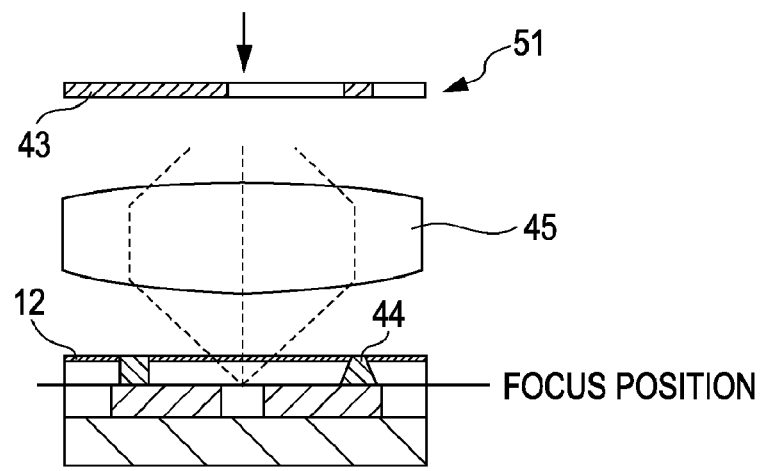

As shown in FIG. 17B, pattern exposure was performed for forming tapered discharge portions using a different mask 51. Reference numeral 44 denotes a part where the tapered discharge portions were to be formed. In this exposure, the imaging (focus) position was set at a −10-μm focus position in order to form discharge portions of a tapered profile. The shape profile of the discharge portions was changed by changing the exposure focal position. A step-and-repeat exposure system KrF excimer laser stepper (FPA-3000EX5, manufactured by Canon) was used as an exposure apparatus, and the exposure amount was 480 J/m$^2$.

Exposure for forming the tapered discharge portions and exposure for forming the straight discharge portions are preferably carried out using the same exposure apparatus from the viewpoint of throughput. Since a straight shape and a tapered shape are formed in a slightly different manner from each other depending on the composition of a coating resin, exposure apparatuses having different illumination optical systems may be used without a problem. Even when the same exposure apparatus is used, the focal depth can be changed by changing the numerical aperture (NA) of the projection optical lens for facilitating the formation of a taper. Alternatively, the aperture of the illumination system can be changed to produce oblique incident light (modified illumination) and increase the focal depth for facilitating the formation of a straight shape or vice versa. Therefore, the tapered and straight shapes can be individually controlled. Instead of the projection exposure system, a system in which a print gap position (the distance between a mask and an object to be exposed) is changed by a proximity exposure system may be used without a problem.

The subsequent steps were performed by the same method as in Example 4.

As a result of an electron microscope observation of sections of the discharge portions in the recording head formed as described above, tapered discharge portions 8, each having a taper angle of 80° (E in FIG. 9B), and straight discharge portions 7, each having a side wall substantially perpendicular to the substrate 1, were formed.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-346266, filed Dec. 22, 2006, which is hereby incorporated by reference herein in its entirety.

What is claimed is:

1. A method for manufacturing a liquid discharge head comprising an energy generating element, which generates energy utilized for discharging a liquid, and a discharge portion provided at a position facing the energy generating element and having a discharge port for discharging the liquid, the method comprising the steps of:
    providing, on a substrate, a pattern constituting a part for an ink passage, which communicates with the discharge portion;
    forming a negative photosensitive resin layer, from which the discharge port is to be formed, on the pattern, the layer having an absorbance per 1 μm thickness of 0.02 to 0.07 for light at 365 nm;
    exposing the layer to an i-line to form the discharge portion, which is tapered in a direction from the substrate to the discharge port; and
    removing the pattern after the discharge portion is formed.

2. The method according to claim 1, wherein the negative photosensitive resin comprises an epoxy resin and a photocationic polymerization initiator.

3. The method according to claim 2, wherein the negative photosensitive resin further comprises an additive that absorbs light at 365 nm.

4. The method according to claim 3, wherein the additive is a sensitizer acting on the photocationic polymerization initiator.

5. The method according to claim 1, wherein the step of exposing the layer includes:
    a first exposure step of exposing the layer to form a first discharge portion; and
    a second exposure step of exposing the layer to form a second discharge portion in which a discharge port is different from that of the first discharge portion,
    wherein the second discharge portion is more tapered toward the discharge port than the first discharge portion.

6. A method for manufacturing a liquid discharge head comprising an energy generating element, which generates energy utilized for discharging a liquid, and a discharge portion provided at a position facing the energy generating element and having a discharge port for discharging the liquid, the method comprising the steps of:
    providing, on a substrate, a pattern constituting a part for an ink passage, which communicates with the discharge portion;
    forming a negative photosensitive resin layer on the pattern to form a member, which constitutes the discharge port;
    exposing the negative photosensitive resin layer to light at a single wavelength to form the discharge portion, which is tapered in a direction from the substrate to the discharge port; and
    removing the pattern after the discharge portion is formed, wherein an absorbance per 1 μm thickness of the layer is 0.02 to 0.07 for light used for the exposure.

* * * * *